US012612712B2

(12) United States Patent
Liu et al.

(10) Patent No.: US 12,612,712 B2
(45) Date of Patent: Apr. 28, 2026

(54) METHOD FOR PREPARING LARGE-SCALE TWO-DIMENSIONAL SINGLE CRYSTAL STACK HAVING INTERLAYER ROTATION ANGLE

(71) Applicant: PEKING UNIVERSITY, Beijing (CN)

(72) Inventors: Kaihui Liu, Beijing (CN); Can Liu, Beijing (CN); Enge Wang, Beijing (CN); Dapeng Yu, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 264 days.

(21) Appl. No.: 18/286,023

(22) PCT Filed: Mar. 14, 2022

(86) PCT No.: PCT/CN2022/080655
§ 371 (c)(1),
(2) Date: Oct. 6, 2023

(87) PCT Pub. No.: WO2022/213777
PCT Pub. Date: Oct. 13, 2022

(65) Prior Publication Data
US 2024/0183064 A1     Jun. 6, 2024

(30) Foreign Application Priority Data

Apr. 7, 2021     (CN) .......................... 202110372541.7

(51) Int. Cl.
*C30B 25/18*      (2006.01)
*C30B 25/16*      (2006.01)
*C30B 25/22*      (2006.01)
*C30B 29/02*      (2006.01)
*C30B 29/40*      (2006.01)
(Continued)

(52) U.S. Cl.
CPC ............ *C30B 25/18* (2013.01); *C30B 25/165* (2013.01); *C30B 25/22* (2013.01); *C30B 29/02* (2013.01); *C30B 29/403* (2013.01); *C30B 29/68* (2013.01); *C30B 33/06* (2013.01); *C30B 33/10* (2013.01)

(58) Field of Classification Search
CPC ....... C30B 23/00; C30B 23/002; C30B 23/02; C30B 23/025; C30B 25/00; C30B 25/02; C30B 25/16; C30B 25/165; C30B 25/18; C30B 25/22; C30B 29/00; C30B 29/02; C30B 29/04; C30B 29/403; C30B 29/60; (Continued)

(56) References Cited

U.S. PATENT DOCUMENTS

2016/0207291 A1*   7/2016  Dimitrakopoulos ........................ C01B 32/186

FOREIGN PATENT DOCUMENTS

CN          113186595 A   *   7/2021   ............. C30B 25/18

* cited by examiner

*Primary Examiner* — Kenneth A Bratland, Jr.
(74) *Attorney, Agent, or Firm* — Scully, Scott, Murphy & Presser, P.C.

(57)          ABSTRACT

A method for preparing a large-scale two-dimensional single crystal material stack which has an interlayer rotation angle. Single crystal substrates are stacked and rotated at a specific angle, a two-dimensional single crystal material is epitaxial on the surface thereof, and then an upper layer and a lower layer of the two-dimensional single crystal material are attached, and a layer of the single crystal substrates on the surface is removed so as to obtain a two-dimensional single crystal stack which has a specific rotation angle. A large-scale two-dimensional single crystal material stack which has an interlayer rotation angle prepared by the described method.

15 Claims, 2 Drawing Sheets

(51) Int. Cl.
    *C30B 29/68*        (2006.01)
    *C30B 33/06*        (2006.01)
    *C30B 33/10*        (2006.01)

(58) Field of Classification Search
    CPC ......... C30B 29/68; C30B 33/00; C30B 33/06;
                         C30B 33/08; C30B 33/10
    USPC .......... 117/84, 88–90, 93–94, 101, 105–107,
                               117/928–929
    See application file for complete search history.

1

METHOD FOR PREPARING LARGE-SCALE TWO-DIMENSIONAL SINGLE CRYSTAL STACK HAVING INTERLAYER ROTATION ANGLE

CROSS-REFERENCE TO RELATED APPLICATIONS

The present application is a U.S. National Phase Entry of International Patent Application No. PCT/CN2022/080655, filed on Mar. 14, 2022, which claims priority of Chinese Patent Application No. 202110372541.7, filed on Apr. 7, 2021, the disclosure of which is incorporated herein by reference in its entirety as part of the present application.

FIELD OF THE INVENTION

The present disclosure relates to the field of material technology, and in particular to a method for preparing a large-scale two-dimensional single crystal stack having an interlayer rotation angle.

BACKGROUND OF THE INVENTION

There are a wide variety of two-dimensional materials, covering a wide range of systems such as conductors, semiconductors, insulators, and magnets. Because their atoms and electrons are confined in a two-dimensional plane, two-dimensional materials exhibit many peculiar properties. Taking graphene as an example, due to its unique structure and atomic bonding manner, single crystal graphene has a series of excellent properties, including extremely high mechanical strength and toughness, good light transmittance, and the highest carrier mobility and saturation current density and highest thermal conductivity among known materials, etc. Therefore, two-dimensional materials have extremely attractive application prospects in the future design and preparation of new functional materials as well as research in mechanics and electronics.

In recent years, research has found that by constructing a two-dimensional material stacked structure, effective and precise control of surface electronic states can be achieved, and a new material structure and research system can be constructed. Since it was proposed, scientists have successively discovered a series of novel physical phenomena such as Mott insulating state, anomalous superconducting state, and molar exciton state in a two-dimensional material stacked structure, which opens up a broad research space for the study of physical properties of low-dimensional materials and the development of devices. In constructing a two-dimensional material stacked structure, an interlayer rotation angle is the most direct and important controllable parameter. By changing the interlayer rotation angle of a two-dimensional material stacked structure, an interlayer coupling strength and molar periodic potential can be controlled, thereby optimizing and improving the performance of the material.

However, so far, in the preparation of two-dimensional material stacked structures, the control of a rotation angle is mostly achieved through operations such as transferring or folding after the material growth is completed. These methods usually have a series of problems such as complex operations, low yields, and harsh conditions, and inevitably expose the material surface to the external environment, resulting in the inability to obtain a large-area clean contact surface with strong interaction. In principle, direct growth of stacked structures is the most ideal method to construct clean two-dimensional stacked structures. However, it is extremely challenging to directly grow large-scale, specific-rotation angle two-dimensional single crystal stacks with a controllable rotation angle. Therefore, a new method to directly prepare large-scale, specific-rotation angle two-dimensional single crystal stacks urgently needs to be developed, which will open up new directions for the research on the physical properties of two-dimensional stacked structures and the development of device and application.

SUMMARY OF THE INVENTION

The present disclosure proposes a method for preparing a large-scale two-dimensional single crystal stack having an interlayer rotation angle. A specific-rotation angle two-dimensional single crystal stack can be obtained by stacking single crystal substrates, rotating the substrates to a specific angle, epitaxially growing two-dimensional single crystal materials on their surfaces, then attaching the upper and lower layers of two-dimensional single crystal materials, and removing one layer of single crystal substrate.

The present disclosure provides a method for preparing a large-scale two-dimensional single crystal material stack having an interlayer rotation angle. The method includes the following steps:

S1. Providing a single crystal substrate stack with a certain interlayer rotation angle; the single crystal substrate stack includes first and second single crystal substrates which are stacked, wherein the first single crystal substrate is located under the second single crystal substrate; the second single crystal substrate is rotated by a certain angle $\alpha$ relative to the first single crystal substrate so that the first crystal orientation of the first single crystal substrate and the second crystal orientation of the second single crystal substrate have an interlayer rotation angle $\alpha$, wherein the first crystal orientation and the second crystal orientation are the same in crystal orientation;

S2. Growing two-dimensional single crystal materials respectively on the opposite surfaces between the two single crystal substrates in the single crystal substrate stack; that is, the first two-dimensional single crystal material is grown on the upper surface of the first single crystal substrate, and the second two-dimensional single crystal material is grown on the lower surface of the second single crystal substrate, so that the first two-dimensional single crystal material also has the interlayer rotation angle $\alpha$ relative to the second two-dimensional single crystal material;

S3. Attaching the first two-dimensional single crystal material to the second two-dimensional single crystal material; and S4. Removing the second single crystal substrate, thereby obtaining a large-scale two-dimensional single crystal material stack having an interlayer rotation angle.

For example, growing two-dimensional single crystal materials respectively on the opposite surfaces between the two single crystal substrates in a single crystal substrate stack includes the following steps: placing the single crystal substrate stack into a chemical vapor deposition equipment, introducing inert gas and reducing gas, and then starting to heat up; and introducing a gas source required for growth or a solid source required for heating growth when the temperature rises to 700~1100° C., wherein the growth time is from 1 s to 48 h.

For example, the two-dimensional single crystal material is graphene or boron nitride.

For example, the single crystal substrate material is one of Cu, Au, Ag, Fe, Ni, Co, Ge, and Pt.

For example, the attaching process includes hot pressing or high temperature bonding.

For example, the process of removing the second single crystal substrate includes one or more of chemical etching, electrochemical etching, and mechanical polishing.

For example, the method includes the following steps:

S1. Providing a single crystal substrate stack with a certain interlayer rotation angle; the single crystal substrate stack includes first and second single crystal substrates which are stacked, wherein the first single crystal substrate is located under the second single crystal substrate; the second single crystal substrate is rotated by a certain angle $\alpha$ relative to the first single crystal substrate so that the first crystal orientation of the first single crystal substrate and the second crystal orientation of the second single crystal substrate have an interlayer rotation angle $\alpha$, wherein the first crystal orientation and the second crystal orientation are the same in crystal orientation;

S2. Growing two-dimensional single crystal materials respectively on the opposite surfaces between the two single crystal substrates in the single crystal substrate stack; placing the single crystal substrate stack into a chemical vapor deposition equipment, introducing Ar and $H_2$, wherein the flow rate of Ar is at least 100 sccm, and the flow rate of $H_2$ is 2~200 sccm, and then starting to heat up, wherein the heating process lasts for 15~90 min; introducing a gas source required for growth or a solid source required for heating growth when the temperature rises to 700~1100° C., wherein an appropriate flow rate of $H_2$ is set, the flow rate of Ar is kept unchanged, and the growth time is from is to 48 h; after the growth is completed, the first two-dimensional single crystal material has been grown on the upper surface of the first single crystal substrate, and the second two-dimensional single crystal material has been grown on the lower surface of the second single crystal substrate, so that the first two-dimensional single crystal material also has the interlayer rotation angle $\alpha$ relative to the second two-dimensional single crystal material;

S3. Attaching the first two-dimensional single crystal material to the second two-dimensional single crystal material;

after the growth is completed, stopping the supply of gas or solid source, and performing high temperature bonding or hot pressing by adjusting the temperature to attach the upper and lower layers of single crystal materials wherein Ar and $H_2$ are used as protective gases;

S4. After the attaching, turning off the heating power, naturally cooling to room temperature wherein Ar and $H_2$ are used as protective gases, and then using chemical etching, electrochemical etching or mechanical polishing to remove the second single crystal substrate, thereby obtaining a large-scale two-dimensional single crystal material stack having an interlayer rotation angle.

For example, steps S1, S3, and S4 are all performed under normal pressure conditions, and step S2 is performed under normal pressure or low pressure.

For example, during the growth process in step S2, different gas sources or solid sources are introduced according to different two-dimensional single crystal materials. For growing graphene, the flow rate of $CH_4$ is 0.1~50 sccm, the flow rate of $H_2$ is 0.1~200 sccm, and the flow ratio of $CH_4$ to $H_2$ is 0.01~100; for growing boron nitride, the temperature for heating a $BH_3NH_3$ reactant area is 50~110° C., and the flow rate of $H_2$ is 0.1~200 sccm.

For example, in step S3, when high temperature bonding is used, the temperature is 1000~1500° C., or when hot pressing is used, the temperature is 400~1500° C. and the applied pressure is 1~100 MPa;

For example, in step S4, a solution of ammonium persulfate or ferric chloride is used for chemical etching. During electrochemical etching, the electrolytic solution is an aqueous electrolytic solution. The electrolyte includes one or more of sulfuric acid, hydrochloric acid, phosphoric acid, ammonium persulfate, and n-heptane, the electrode is an inert metal, and the electric field strength is 0.1 V/cm~10 V/cm.

The present disclosure also provides a large-scale two-dimensional single crystal material stack having an interlayer rotation angle prepared by the above method.

BRIEF DESCRIPTION OF THE DRAWINGS

In order to more clearly illustrate the technical solutions of examples of the present disclosure, the drawings of the examples will be briefly introduced below. Apparently, the drawings in the following description only relate to some examples of the present disclosure and do not limit the present disclosure.

DETAILED DESCRIPTION OF THE INVENTION

Figure 1:
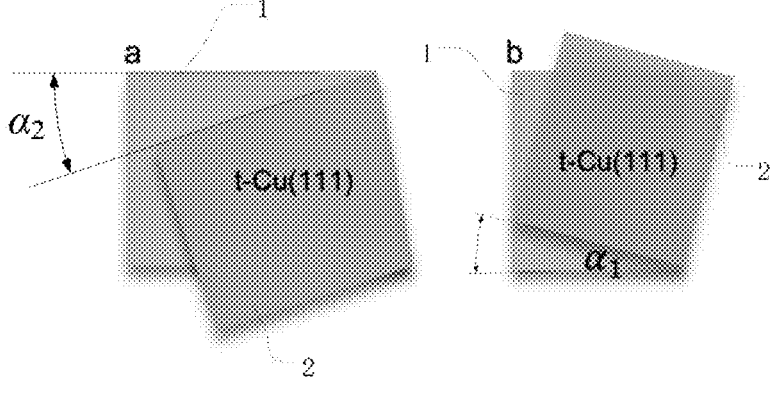
FIG. 1 is a schematic diagram showing an angle control of stacked copper foils according to the present disclosure.

It should be understood that any and all embodiments/examples of the present disclosure may be combined with technical features in another embodiment/example or other embodiments/examples to obtain additional embodiments on the premise of no conflict. The present disclosure includes additional embodiments obtained from such combinations.

The term such as "include", "contain", "comprise" or the like as used in the present disclosure means that the element appearing before the term includes the elements listed after the term and their equivalents, without excluding unlisted elements. The term "include", "contain", or "comprise" as used herein can be open, semi-closed and closed, in other words, the term also includes "consisting essentially of" or "consisting of."

It should be understood that the singular form (e.g., "a") as used herein may include plural referents unless otherwise specified.

Unless otherwise stated, when a range of any kind (e.g., temperature, growth time) is disclosed or claimed, it is intended to individually disclose or claim every possible value that the range could reasonably encompass, including both endpoints and any sub-ranges encompassed therein. For example, "a temperature of 700 to 1100 degrees Celsius" should be understood to include the endpoints 700 and 1100 degrees Celsius, as well as the sub-ranges 700-800, 800-900, 700-900, 800-1000, 800-1100, 900-1000 degrees Celsius, etc.

The present disclosure provides a method for preparing a large-scale two-dimensional single crystal material stack having an interlayer rotation angle. The method includes the following steps:

S1. Providing a single crystal substrate stack with a certain interlayer rotation angle; the single crystal substrate stack includes first and second single crystal substrates which are stacked, wherein the first single crystal substrate is located under the second single crystal substrate; The second single crystal substrate is rotated by a certain angle α relative to the first single crystal substrate so that the first crystal orientation of the first single crystal substrate and the second crystal orientation of the second single crystal substrate have an interlayer rotation angle α, wherein the first crystal orientation and the second crystal orientation are the same in crystal orientation;

S2. Growing two-dimensional single crystal materials respectively on the opposite surfaces between the two single crystal substrates in the single crystal substrate stack; that is, the first two-dimensional single crystal material is grown on the upper surface of the first single crystal substrate, and the second two-dimensional single crystal material is grown on the lower surface of the second single crystal substrate, so that the first two-dimensional single crystal material also has the interlayer rotation angle α relative to the second two-dimensional single crystal material;

S3. Attaching the first two-dimensional single crystal material to the second two-dimensional single crystal material;

S4. Removing the second single crystal substrate, thereby obtaining a large-scale two-dimensional single crystal material stack having an interlayer rotation angle.

In the present disclosure, a two-dimensional single crystal stack having a specific-rotation angle can be quickly obtained by stacking single crystal substrates, rotating the substrates to a specific angle, epitaxially growing two-dimensional single crystal materials on their surfaces, then attaching the upper and lower layers of two-dimensional single crystal materials, and removing one layer of single crystal substrate. The method proposed in the present disclosure solves the technical problems of tedious steps, easy contamination, and low success rate in preparing two-dimensional single crystal materials having a specific-rotation angle through mechanical peeling and stacking. Through a very simple method, a high-quality two-dimensional single crystal stack having a specific-rotation angle can be prepared directly and quickly.

Advantages of the present disclosure include one or more of:

1. In the present disclosure, two-dimensional single crystal materials are epitaxially grown on the surface of substrates after being rotated to a specific angle, without the need for dry or wet transferring, thereby simplifying the growth process and reducing preparation costs;

2. The present disclosure directly obtains a two-dimensional single crystal stack having a rotation angle through epitaxial growth. The rotation angle is controllable, the sample has high quality and large size, and the possibility of contamination in the intermediate process is reduced;

3. The present disclosure proposes an effective method to directly obtain a two-dimensional single crystal stack having a specific rotation angle: by rotating substrates to a specific rotation angle, epitaxially growing two-dimensional single crystal materials on the surface of substrates, and then attaching the two-dimensional single crystal materials, a two-dimensional single crystal stack with a specific rotation angle can be obtained;

4. The method disclosed herein is simple and effective, has a short preparation cycle, and is helpful for the practical application and industrial production of a two-dimensional single crystal stack having a specific rotation angle.

The present disclosure will be further described in detail below with reference to specific examples. The specific operations are routine operations unless otherwise specified. The raw materials can be obtained from public commercial channels unless otherwise specified.

The present disclosure provides a method for preparing a large-scale two-dimensional single crystal stack having an interlayer rotation angle. The method includes the following steps:

S1. Providing a single crystal substrate stack with a certain interlayer rotation angle;

In this step, as shown in FIG. 1, the plurality of single crystal substrates include first single crystal substrate 1 and second single crystal substrate 2 which are stacked. The first single crystal substrate 1 is located under the second single crystal substrate. One single crystal substrate can be cut into two single crystal substrates of the same size or with little difference in size. The first single crystal substrate 1 and the second single crystal substrate 2 are stacked and the second single crystal substrate 2 is rotated by a certain angle α relative to the first single crystal substrate, as shown by α2 in FIG. 1(a) and a1 in FIG. 1(b), that is, there is a certain interlayer rotation angle α between the first single crystal substrate 1 and the second single crystal substrate 2. In one embodiment, the overlapping area between the first single crystal substrate 1 and the second single crystal substrate 2 may be 30%-90% of the area of the first single crystal substrate 1 or the second single crystal substrate 2. The first crystal orientation of the first single crystal substrate 1 and the second crystal orientation of the second single crystal substrate 2 have a certain interlayer rotation angle α, wherein the first crystal orientation and the second crystal orientation are the same in crystal orientation. The single crystal substrate includes Cu, Au, Ag, Fe, Ni, Co, Ge, Pt, etc., with a thickness between 1 μm~1 cm and an area between 1 mm$^2$~1 m$^2$. In one embodiment, the Cu(111) direction of the first single crystal copper foil 1 and the Cu(111) direction of the second single crystal copper foil 2 have a certain interlayer rotation angle α.

The interlayer rotation angle α can be designed as needed. For example, the interlayer rotation angle α can be 0°<α<90°.

In this step, it is only necessary to gently stack the first single crystal substrate 1 and the second single crystal substrate 2 together. There is no need to perform special processing on them, and there is also no need to specifically set a certain gap between the first single crystal substrate 1 and the second single crystal substrate 2.

S2. Growing two-dimensional single crystal materials respectively on the opposite surfaces between the two single crystal substrates in the single crystal substrate stack;

In this step, the single crystal substrate stack is placed into a chemical vapor deposition equipment, inert gas and reducing gas are introduced, and then the temperature begins to rise; when the temperature rises to 700~1100° C., a gas source required for growth or a solid source required for heating growth is introduced, wherein the growth time is 1 s~48 h.

Figure 2:
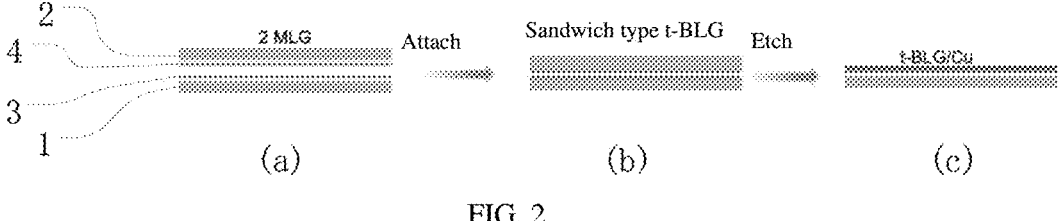
FIG. 2 is a schematic diagram which shows high temperature bonding and the removal of a surface substrate layer according to the present disclosure.

In one embodiment, the single crystal substrate stack is placed into a chemical vapor deposition equipment, Ar and $H_2$ are introduced, wherein the flow rate of Ar is at least 300 sccm, the flow rate of $H_2$ is 0.1~200 sccm, and the working pressure is normal pressure (i.e., one atmosphere or about $1\times10$ Pa), and then the temperature begins to rise, wherein the temperature rising process lasts for 15~90 min; when the temperature rises to 700~1100° C., $CH_4$ is introduced, an appropriate flow rate of $H_2$ is set, the flow rate of Ar remains unchanged, and the growth time is 1 s~48 h. As shown in FIG. 2(a), two-dimensional single crystal materials are grown respectively on the two opposite surfaces of the first single crystal substrate 1 and the second single crystal substrate 2, that is, the first two-dimensional single crystal material 3 is grown on the upper surface of the first single crystal substrate 1, and the second two-dimensional single crystal material 4 is grown on the lower surface of the second single crystal substrate 2. In one embodiment, the first two-dimensional single crystal material 3 and the second two-dimensional single crystal material 4 are both monolayer graphene.

Because the growth of two-dimensional single crystal materials has a certain selectivity and there is a certain interlayer rotation angle α between the first single crystal substrate 1 and the second single crystal substrate 2, the first two-dimensional single crystal material 3 and the second two-dimensional single crystal material 4 also have a certain interlayer rotation angle m. The obtained two-dimensional single crystal material has a thickness between 0.1 nm and 100 μm and an area between 1 mm$^2$ and 1 m$^2$.

S3. Attaching the two-dimensional single crystal materials;

In this step, as shown in FIG. 2(b), the first two-dimensional single crystal material 3 and the second two-dimensional single crystal material 4 are attached together using high temperature bonding or hot pressing. In one embodiment, after the growth of step S2 is completed, the supply of $CH_4$ gas source is stopped, and high temperature bonding or hot pressing is performed to attach the upper and lower layers of single crystal materials at a temperature of 1070~1074° C. wherein Ar and $H_2$ are used as protective gases.

S4. Removing the single crystal substrate;

In this step, as shown in FIG. 2(c), after the attaching is completed, the heating power is turned off, and the single crystal material stack is allowed to naturally cool to room temperature using Ar and $H_2$ as protective gases. Chemical etching, electrochemical etching, or mechanical polishing is used to remove the second single crystal substrate 2 to expose the two-dimensional single crystal material stack having a specific rotation angle to the surface. That is, a large-scale two-dimensional single crystal material stack having a specific rotation angle is obtained.

The present disclosure includes the following beneficial effects:

1. In the present disclosure, substrates are rotated to a specific rotation angle, and then a two-dimensional single crystal material is epitaxially grown on their surfaces, thereby avoiding a dry or wet transfer process, simplifying the growth process, reducing the preparation cost, and obtaining a two-dimensional single crystal stack having a rotation angle with high repeatability;

2. The two-dimensional single crystal stack having a rotation angle grown in this embodiment is large in size and high in quality, and has good application prospects.

Embodiment 1: A method for preparing a large-scale single crystal graphene stack having a specific rotation angle. The method includes the following steps:

1. Stacking multiple single crystal copper foils and controlling the angle, placing them into a chemical vapor deposition equipment, introducing Ar and $H_2$, wherein the flow rate of Ar is at least 300 sccm, the flow rate of $H_2$ is 0.1~200 sccm, and the working pressure is normal pressure (i.e., one atmosphere or about $1\times10^5$ Pa), and then increasing the temperature, wherein the temperature rise process lasts for 15 to 90 minutes;

2. When the temperature rises to 700~1100° C., introducing $CH_4$ and setting an appropriate flow rate of $H_2$, wherein the flow rate of Ar remains unchanged and the growth time is 1 s~48 h;

3. After the growth is completed, stopping the supply of $CH_4$ gas source, and performing high temperature bonding or hot pressing to attach the upper and lower layers of single crystal materials at a temperature of 1070~1074° C. wherein Ar and $H_2$ are used as protective gases;

4. After attaching, turning off the heating power, naturally cooling to room temperature wherein Ar and $H_2$ are used as protective gases, then using chemical etching or electrochemical etching to remove the single crystal copper substrate layer from the surface so as to expose the graphene stack having a specific rotation angle to the surface, thereby obtaining a large-scale single crystal graphene stack having a specific rotation angle.

The working pressure in the above method is normal pressure, which is one atmosphere or about $1\times10^5$ Pa.

The beneficial effects of the present disclosure are verified through the following examples:

Example 1: The method for preparing a large-scale single crystal graphene having a specific rotation angle in this example was carried out according to the following steps:

1. Single crystal copper foils were cut into a suitable size, then stacked at a specific angle, and placed into a chemical vapor deposition equipment. Ar and $H_2$ were introduced, wherein the flow rate of Ar was 500 sccm, the flow rate of $H_2$ was 20 sccm, and the working pressure was normal pressure (i.e., one atmosphere or about $1\times10^5$ Pa). Then the temperature was increased, and the heating process lasted for 60 min;

2. When the temperature was increased to 1030° C., $CH_4$ was introduced at a flow rate of 2 sccm, the flow rate of $H_2$ was set as 50 sccm, the flow rate of Ar was kept unchanged, and the growth time was 30 minutes;

3. After the growth was completed, the $CH_4$ supply was stopped, the temperature was adjusted to 1070° C., and high temperature bonding was performed using Ar and $H_2$ as protective gases to attach the upper and lower layers of single crystal materials, wherein the working pressure was normal pressure (i.e., one atmosphere or about $1\times10^5$ Pa);

4. After the attaching, the heating power was turned off, and the stack was allowed to cool naturally to room temperature using Ar and $H_2$ as protective gases. Chemical etching was performed using ammonium persulfate solution to remove the single crystal Cu substrate layer from the surface, so that the graphene stack having a specific rotation angle was exposed to the surface, thereby completing the preparation of a large-scale graphene stack having a specific rotation angle.

Figure 3:
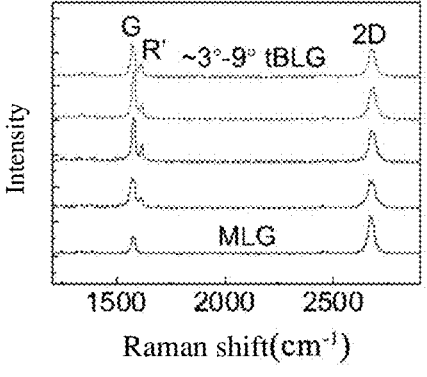
FIG. 3 is a Raman spectrum of single crystal graphene having a specific rotation angle prepared in Example 1 of the present disclosure.
Figure 4:
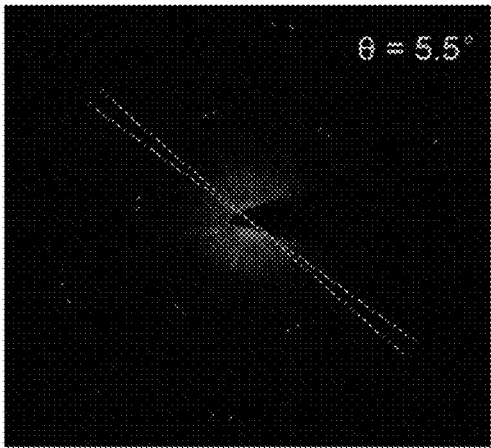
FIG. 4 is an electron diffraction pattern of a selected area of single crystal graphene having a specific rotation angle prepared in Example 1 of the present disclosure.

The Raman spectrum (laser wavelength is 532 nm) of the single crystal graphene stack having a rotation angle prepared in this example is shown in FIG. 3. From the Raman spectrum, it can be seen that the graphene has significant 2D peak and G peak, and further has an extra R' peak compared with a single-layer graphene, which is one of the characteristics of double-layer graphene with a small rotation angle ($\alpha$ is 3~9°). No D peak was found in the Raman spectrum of the graphene, indicating that the prepared single crystal graphene is large in size and high in quality. In addition, the electron diffraction pattern of the selected area of the single crystal sample prepared in this example is shown in FIG. 4. It is found that two sets of diffraction spots with an included angle of 5.5° appear, which further verifies the results of the Raman spectrum, that is, this sample was a large-scale single-crystal graphene stack with a 5.5° rotation angle.

Example 2: The method for preparing a large-scale single crystal graphene stack having a specific rotation angle in this example was carried out according to the following steps:

1. A single crystal copper foil was folded and then placed into a chemical vapor deposition equipment. Ar and $H_2$ were introduced, wherein the flow rate of Ar was 500 sccm, the flow rate of $H_2$ was 20 sccm, and the working pressure was normal pressure (i.e., one atmosphere or about $1 \times 10^5$ Pa). Then the temperature was increased, and the heating process lasted for 60 min;

2. When the temperature was increased to 1030° C., $CH_4$ was introduced at a flow rate of 2 sccm, the flow rate of $H_2$ was set as 50 sccm, the flow rate of Ar was kept unchanged, and the growth time was 30 minutes;

3. After the growth was completed, the $CH_4$ supply was stopped, and hot pressing was performed using Ar and $H_2$ as protective gases to attach the upper and lower layers of single crystal materials, wherein the applied pressure was 100 MPa, and the working pressure was normal pressure (i.e., one atmosphere or about $1 \times 10^5$ Pa);

4. After the attaching, the heating power was turned off, and the stack was allowed to cool naturally to room temperature using Ar and $H_2$ as protective gases. Electrochemical etching was performed using ammonium persulfate solution and a copper electrode to remove the Cu substrate layer from the surface, so that the graphene stack having a specific rotation angle was exposed to the surface, thereby completing the preparation of a large-scale single crystal graphene stack having a specific rotation angle.

Embodiment 2: A method for preparing a large-scale single crystal boron nitride having a specific rotation angle.

In this embodiment, a large-scale single crystal boron nitride stack having a specific rotation angle is obtained by growing two-dimensional single crystal boron nitride on the surfaces of layers of substrates.

Example 3: The method for preparing a large-scale single crystal boron nitride having a specific rotation angle in this example was carried out according to the following steps:

1. Single crystal copper foils were cut into a suitable size, then stacked at a specific angle, and placed into a chemical vapor deposition equipment. Ar and $H_2$ were introduced, wherein the flow rate of Ar was 500 sccm, the flow rate of $H_2$ was 10 sccm, and the working pressure was normal pressure (i.e., one atmosphere or about $1 \times 10^5$ Pa). Then the temperature was increased, and the heating process lasted for 60 min;

2. When the temperature was increased to 1050° C., the $BH_3NH_3$ reactant area began to be heated at a heating temperature of 80° C., the flow rates of $H_2$ and Ar were kept unchanged, the working pressure was $1 \times 10^5$ Pa, and the growth time was 2 hours;

3. After the growth was completed, the $BH_3NH_3$ reactant area was cooled down quickly, the temperature was adjusted to 1074° C., and high temperature bonding was performed using Ar and $H_2$ as protective gases to attach the upper and lower layers of single crystal materials, wherein the working pressure was normal pressure (i.e., one atmosphere or about $1 \times 10^5$ Pa);

4. After the attaching, the heating power was turned off, and the single crystal materials were allowed to cool naturally to room temperature using Ar and $H_2$ as protective gases, chemical etching was performed using ammonium persulfate solution to remove the Cu substrate layer from the surface, so that the boron nitride stack having a specific rotation angle was exposed to the surface, thereby completing the preparation of a large-scale single crystal boron nitride stack having a specific rotation angle.

The double-layer single crystal boron nitride prepared in this example was large in size and high in quality, and had a controllable rotation angle.

The above examples are only illustrative of the principles and effects of the present disclosure, and are not intended to limit the present invention. Those skilled in the art can make various modifications and variations without departing from the spirit and scope of the present invention. Such modifications and variations are all within the scope defined by the claims.

This application claims priority to the Chinese Patent Application No. 202110372541.7, which was filed on Apr. 7, 2021 and entitled "Method for preparing large-scale two-dimensional single crystal stack having an interlayer rotation angle." The contents disclosed in the above-mentioned Chinese patent application are incorporated herein in their entirety as part of this application.

What is claimed is:

1. A method for preparing a two-dimensional single crystal material stack having an interlayer rotation angle $\alpha$, wherein the method includes the following steps:

S1. providing a single crystal substrate stack with the interlayer rotation angle $\alpha$;

the single crystal substrate stack includes first and second single crystal substrate which are stacked, wherein the first single crystal substrate is located under the second single crystal substrate; the second single crystal substrate is rotated by the interlayer rotation angle $\alpha$ relative to the first single crystal substrate so that a first crystal orientation of the first single crystal substrate and a second crystal orientation of the second single crystal substrate have the interlayer rotation angle, wherein the first crystal orientation of the first single crystal substrate and the second crystal orientation of the second single crystal substrate are the same in crystal orientation;

S2. growing two-dimensional single crystal materials respectively on the opposite surfaces between the two single crystal substrates in the single crystal substrate stack;

that is, a first two-dimensional single crystal material is grown on an upper surface of the first single crystal substrate, and a second two-dimensional single crystal material is grown on a lower surface of the second single crystal substrate, so that the first two-dimensional single crystal material also has the interlayer rotation angle α relative to the second two-dimensional single crystal material;

S3. attaching the first two-dimensional single crystal material to the second two-dimensional single crystal material; and S4. removing the second single crystal substrate, thereby obtaining the two-dimensional single crystal material stack having the interlayer rotation angle α.

2. The method of claim 1, wherein the growing two-dimensional single crystal materials respectively on the opposite surfaces between the two single crystal substrates in a single crystal substrate stack includes the following steps: placing the single crystal substrate stack into a chemical vapor deposition equipment, introducing inert gas and reducing gas, and then starting to heat up; and introducing a gas source required for growth or a solid source required for heating growth when a temperature rises to 700~1100° C., wherein the growth time is from 1 s to 48 h.

3. The method according to claim 1, wherein the two-dimensional single crystal material is graphene or boron nitride.

4. The method according to claim 1, wherein the single crystal substrate material is one of Cu, Au, Ag, Fe, Ni, Co, Ge, and Pt.

5. The method according to claim 1, wherein the attaching process includes hot pressing or high temperature bonding.

6. The method according to claim 1, wherein the process of removing the second single crystal substrate includes one or more of chemical etching, electrochemical etching, and mechanical polishing.

7. The method according to claim 1, comprising the following steps:

in S2. growing the two-dimensional single crystal materials respectively on the opposite surfaces between the two single crystal substrates in the single crystal substrate stack;

placing the single crystal substrate stack into a chemical vapor deposition equipment, introducing Ar and H$_2$, wherein a flow rate of Ar is at least 100 sccm, and a flow rate of H$_2$ is 2~200 sccm, and then starting to heat up, wherein a heating process lasts for 15~90 min; introducing a gas source required for growth or a solid source required for heating growth when a temperature rises to 700~1100° C., wherein an appropriate flow rate of H$_2$ is set, the flow rate of Ar is kept unchanged, and a growth time is from 1 s to 48 h; after the growth is completed, the first two-dimensional single crystal material has been grown on the upper surface of the first single crystal substrate, and the second two-dimensional single crystal material has been grown on the lower surface of the second single crystal substrate, so that the first two-dimensional single crystal material also has the interlayer rotation angle α relative to the second two-dimensional single crystal material;

in S3. attaching the first two-dimensional single crystal material to the second two-dimensional single crystal material;

after the growth is completed, stopping the supply of gas or solid source, and performing high temperature bonding or hot pressing by adjusting a temperature to attach upper and lower layers of single crystal material wherein Ar and H$_2$ are used as protective gases; and in S4. after attaching, turning off the heating power, naturally cooling to room temperature wherein Ar and H$_2$ are used as protective gases, and then using chemical etching, electrochemical etching or mechanical polishing to remove the second single crystal substrate, thereby obtaining the two-dimensional single crystal material stack having the interlayer rotation angle α.

8. The method according to claim 1, wherein steps S1, S3 and S4 are all performed under normal pressure conditions, and step S2 is performed under normal pressure or low pressure.

9. The method according to claim 1, wherein during a growth process in step S2, different gas sources or solid sources are introduced according to different two-dimensional single crystal materials, wherein for growing graphene, CH$_4$ is introduced at a flow rate of 0.1~50 sccm, a flow rate of H$_2$ is 0.1~200 sccm, and a flow ratio of CH$_4$ to H$_2$ is 0.01~100;

for growing boron nitride, a temperature for heating a BH$_3$NH$_3$ reactant area is 50~110° C., and a flow rate of H$_2$ is 0.1~200 sccm.

10. The method according to claim 1, wherein a temperature of high temperature bonding in step S3 is 1000~1500° C., or a temperature of hot pressing in step S3 is 400~1500° C., and the applied pressure of hot pressing in step S3 is 1~100 MPa.

11. The method according to claim 1, wherein in step S4, a solution of ammonium persulfate or ferric chloride is used for chemical etching, and an aqueous electrolytic solution is used as an electrolytic solution for electrochemical etching, wherein an electrolyte includes one or more of sulfuric acid, hydrochloric acid, phosphoric acid, ammonium persulfate, and n-heptane, the electrode is an inert metal, and the electric field strength is 0.1 V/cm~10 V/cm.

12. The method according to claim 7, wherein steps S1, S3 and S4 are all performed under normal pressure conditions, and step S2 is performed under normal pressure or low pressure.

13. The method according to claim 7, wherein during a growth process in step S2, different gas sources or solid sources are introduced according to different two-dimensional single crystal materials, wherein for growing graphene, CH$_4$ is introduced at a flow rate of 0.1~50 sccm, a flow rate of H$_2$ is 0.1~200 sccm, and a flow ratio of CH$_4$ to H$_2$ is 0.01~100;

for growing boron nitride, a temperature for heating a BH$_3$NH$_3$ reactant area is 50~110° C., and a flow rate of H$_2$ is 0.1~200 sccm.

14. The method according to claim 7, wherein the temperature of high temperature bonding in step S3 is 1000~1500° C., or the temperature of hot pressing in step S3 is 400~1500° C., and an applied pressure of hot pressing in step S3 is 1~100 MPa.

15. The method according to claim 7, wherein in step S4, a solution of ammonium persulfate or ferric chloride is used for chemical etching, and an aqueous electrolyte solution is used as an electrolyte solution for electrochemical etching, wherein an electrolyte includes one or more of sulfuric acid, hydrochloric acid, phosphoric acid, ammonium persulfate, and n-heptane, an electrode is an inert metal, and an electric field strength is 0.1 V/cm~10 V/cm.

* * * * *